(12) United States Patent
Ayazi et al.

(10) Patent No.: US 7,176,770 B2
(45) Date of Patent: Feb. 13, 2007

(54) CAPACITIVE VERTICAL SILICON BULK ACOUSTIC RESONATOR

(75) Inventors: Farrokh Ayazi, Atlanta, GA (US); Siavash Pourkamali, Smyrna, GA (US); Gavin Kar-Fai Ho, Vancouver (CA)

(73) Assignee: Georgia Tech Research Corp., Atlanta, GA (US)

(*) Notice: Subject to any disclaimer, the term of this patent is extended or adjusted under 35 U.S.C. 154(b) by 106 days.

(21) Appl. No.: 11/208,818

(22) Filed: Aug. 22, 2005

(65) Prior Publication Data

US 2006/0044078 A1 Mar. 2, 2006

Related U.S. Application Data

(60) Provisional application No. 60/503,909, filed on Aug. 24, 2004.

(51) Int. Cl.
*H03H 9/08* (2006.01)
*H03H 9/24* (2006.01)
*H03H 9/46* (2006.01)

(52) U.S. Cl. .................. 333/186; 333/188; 333/200

(58) Field of Classification Search ......... 333/186–188
See application file for complete search history.

(56) References Cited

U.S. PATENT DOCUMENTS

| | | | | |
|---|---|---|---|---|
| 5,976,994 A | * | 11/1999 | Nguyen et al. | 438/795 |
| 6,238,946 B1 | * | 5/2001 | Ziegler | 438/50 |
| 6,600,389 B2 | * | 7/2003 | Ma et al. | 333/186 |
| 6,707,351 B2 | * | 3/2004 | Gorrell | 333/188 |
| 2005/0195050 A1 | * | 9/2005 | Lutz et al. | 333/186 |
| 2005/0242904 A1 | * | 11/2005 | Lutz et al. | 333/200 |

OTHER PUBLICATIONS

Masanori Ueda, et al., "Ultra-miniaturized and high performance PCS SAW duplexer with steep cut-off filters", MTT-S 2004, vol. 2, pp. 913-916, Jun. 2004.
R. C. Ruby, et al, "Thin film bulk wave acoustic resonators (FBAR) for wireless applications", Ultrasonics Symposium, Oct. 2001, vol. 1, pp. 813-821.
S. Li, et al, "Micromechanical hollow disk ring resonators", MEMS 2004, pp. 821-824.
S. Pourkamali and F. Ayazi, "SOI-based HF and VHF single—crystal silicon resonators with sub-100nm nanometer vertical capacitive gaps", Transducers '03, pp. 837-840, The 12th International Conf. on Solid State Sensors, Actuators and Microsystems, Boston, Jun. 8-12, 2003.

(Continued)

*Primary Examiner*—Barbara Summons
(74) *Attorney, Agent, or Firm*—Kenneth W. Float

(57) ABSTRACT

Disclosed are high frequency, vertical silicon bulk acoustic resonators. Resonator structures having a relatively large transduction areas fabricated using a HARPSS fabrication process provide for high frequency capacitive resonators with significantly low impedance values. Impedance values as low as a few kilo-Ohms to sub-kilo-Ohm and quality factors in the range of 20,000 to 90,000 in the VHF range have been achieved for a first thickness mode of fabricated vertical silicon bulk acoustic resonators. Resonant frequencies as high as 983 MHz have been demonstrated for higher third thickness modes of the vertical silicon bulk acoustic resonators.

20 Claims, 4 Drawing Sheets

OTHER PUBLICATIONS

S. Pourkamali, et al, "VHF single crystal silicon capacitive elliptic bulk-mode disk resonators part II: implementation and characterization", JMEMS, vol. 13, No. 6, Dec. 2004.

S. Pourkamali and F. Ayazi, "High frequency capacitive micromechanical resonators with reduced motional resistance using the HARPSS technology", proceedings, 5th Silicon RF topical meeting 2004, pp. 147-150.

A. San Paulo et al., Atomic Force Microscopy Characterization of Electromechanical Properties of RF Acoustic Bulk Wave Resonators, MEMS 2004, pp. 169-172.

Siavash Pourkamali et al., "High-Q Single Crystal Silicon HARPSS Capacitive Beam Resonators With Self-Aligned Sub-100-nm Transduction Gaps", Journal of Microelectromechanical Systems, vol. 12, No. 4, Aug. 2003, pp. 487.

J. D. Larson, et al, "Power handling and temperature coefficient studies in FBAR duplexers for the 1900 MHz PCS band", Ultrasonics Symposium, Oct. 2000, vol. 1, pp. 869-874.

* cited by examiner

In vacuum
Q ~ 28,700 at 213.4MHz
$V_p = 100V$, $R_m = 6.3k\Omega$
3dB BW = 7.4 kHz 3rd mode in vacuum
Q = 3100 @ 502 MHz
$V_p$ = 100V
$R_m$ = 360kΩ
W = 15μm, L = 150μm
t = 10μm, g = 145nm
$L_S$ = 7.5μm, $W_S$ = 3μm
3dB BW = 162 kHz

CAPACITIVE VERTICAL SILICON BULK ACOUSTIC RESONATOR

This application claims the benefit of U.S. Provisional Application No. 60/503,909, filed Aug. 24, 2004.

BACKGROUND

The present invention relates generally to semiconductor processing and fabrication methods, and more particularly, to a capacitive vertical silicon bulk acoustic resonator.

High frequency mechanical resonators such as surface acoustic wave (SAW) and film bulk acoustic wave resonators (FBAR) and filters are widely used in RF front-end duplexers as band-select filters. Such resonators are discussed in Masanori Ueda, et al., "Ultra-miniaturized and high performance PCS SAW duplexer with steep cut-off filters", MTT-S 2004, Vol. 2, pp. 913–916, and R. C. Ruby, et al, "Thin film bulk wave acoustic resonators (FBAR) for wireless applications", Ultrasonics Symposium, 2001, Vol. 1, pp. 813–821, respectively.

Recent developments in silicon micromachining technologies have paved the way for implementation of high frequency silicon capacitive resonators with close to one order of magnitude higher quality factors (Q) compared to the SAW resonators and film bulk acoustic wave resonators. Such devices are gradually entering the market, opening up new opportunities for more advanced wireless communication systems. Due to their lithographically defined resonant frequencies, in-plane capacitive resonators with operating frequencies in a wide range from tens of kHz up to GHz can be implemented on the same substrate simultaneously. This will allow implementation of multi-band wireless communication systems.

In addition, due to their much larger Q values compared to piezoelectric resonators, capacitive resonators may enable direct channel selection right after the antenna resulting in dramatic simplification of the transceiver architectures. Low cost batch fabrication using conventional silicon processing techniques is another advantage for silicon resonators.

Despite resonant frequencies in the VHF and UHF range with quality factors as high as a few tens of thousands, high equivalent electrical impedance remains the major drawback for incorporation of such devices in electronic systems. Fabrication and mechanical design techniques have been utilized to alleviate the impedance issue, but the demonstrated impedances in the VHF and UHF range have heretofore not been promising. See for example, S. Li, et al, "Micromechanical hollow disk ring resonators", MEMS 2004, pp. 821–824, S. Pourkamali and F. Ayazi, "SOI-based HF and VHF single-crystal silicon resonators with sub-100 nm nanometer vertical capacitive gaps", Transducers '03, pp. 837–840, S. Pourkamali, et al, "VHF single crystal silicon capacitive elliptic bulk-mode disk resonators part II: implementation and characterization", JMEMS, Vol. 13, No. 6, December 2004, and S. Pourkamali and F. Ayazi, "High frequency capacitive micromechanical resonators with reduced motional resistance using the HARPSS technology", Proceedings, 5th Silicon RF topical meeting 2004, pp. 147–150.

The S. Pourkamali et al. paper "High frequency capacitive micromechanical resonators with reduced motional resistance using the HARPSS technology", Proceedings, 5th Silicon RF topical meeting 2004, pp. 147–150, discusses disk resonators that are somewhat similar in function to the capacitive vertical silicon bulk acoustic resonator disclosed herein. However, nothing is disclosed or suggested in this paper regarding a resonator element having a length-to-frequency-determining-width ratio larger than one, or a resonator element that comprises a bar having rectangular cross sections, for example.

A paper entitled "High-Q Single Crystal Silicon HARPSS Capacitive Beam Resonators With Self-Aligned Sub-100-nm Transduction Gaps" by Siavash Pourkamali et al., published in Journal of Microelectromechanical Systems, Vol. 12, No. 4, August 2003, discusses capacitive beam resonators that are somewhat similar to the capacitive vertical silicon bulk acoustic resonator disclosed herein. However, nothing is disclosed or suggested in this paper regarding a resonator element that is coupled by way of support structures to bias pads, or that the resonant frequency of the resonator element is primarily determined by a single in-plane lateral dimension, for example.

It would be desirable to have capacitive vertical silicon bulk acoustic resonators that operate in the HF/VHF/UHF bands, exhibit low impedance values and have quality factors that are as high as possible.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
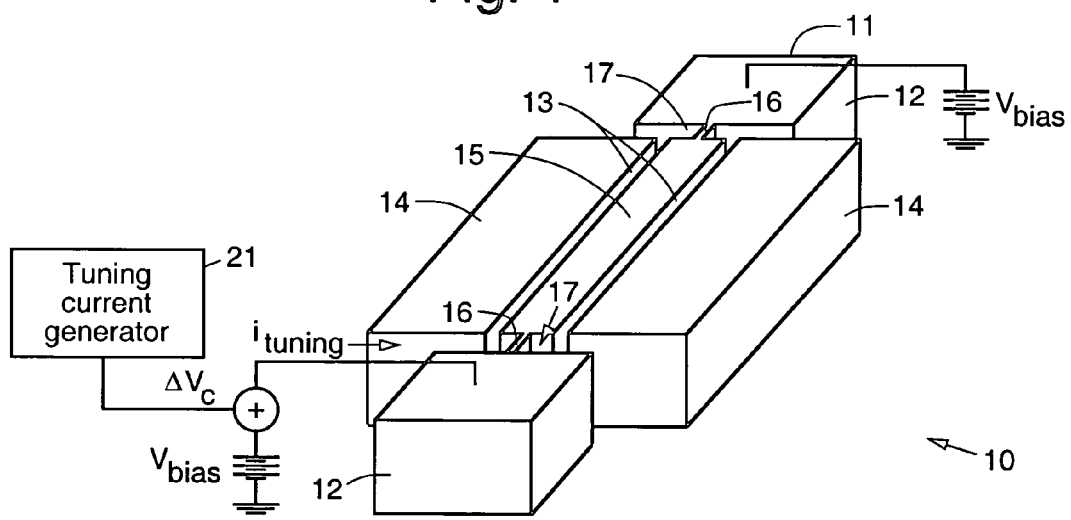
FIG. 1 illustrates a first exemplary embodiment of a capacitive silicon bulk acoustic wave resonator (SiBAR)

Referring to the drawing figures, FIG. 1 illustrates a first exemplary embodiment of a vertical capacitive silicon bulk acoustic wave resonator (SiBAR) 10. The vertical capacitive silicon bulk acoustic wave resonator 10 may be considered to be a vertically placed version of an FBAR having a bare silicon resonating membrane that is operated electrostatically in its horizontal width longitudinal mode. The resonance frequency of the resonator 10 in its width longitudinal mode is primarily determined by its in plane width (the smaller in-plane dimension as shown in FIG. 1). The in-plane length of the resonator 10 and its vertical thickness do not directly affect its resonance frequency and can be optimized to provide optimal quality factor and impedance for the resonator. In some cases the frequency determining dimension, referred to as the width, may be larger than the other in-plane dimension.

The vertical capacitive silicon bulk acoustic wave resonator 10 comprises a silicon substrate 11 comprising one or more bias pads 12 that are separated from an elongated portion of the silicon substrate 11. The elongated portion of the silicon substrate 11 comprises a single crystal silicon (SCS) resonator element 15 (or resonating membrane 15). Single crystal silicon is an anisotropic material, as is well-known to those skilled in the art. The resonator element 15 is connected to the bias pads 12 by one or more silicon bridge portions 16 or support beams 16 disposed at respective ends of the resonator element 15. The bias pads 12 form anchors in or to the substrate 11 that allow the resonator element 15 to be suspended between the support beams 16.

Electrodes 14, which may comprise polysilicon, for example, are disposed adjacent sides of the resonator element 15 and are separated therefrom by capacitive gaps 13. The capacitive gaps 13 may comprise air gaps, or may be filed with a fluid material. The resonator element 15 is separated from adjacent edges of the respective electrodes 14 by openings 17 such as air gaps.

It is desirable that the size of the one or more silicon support beams 16 be relatively small, and the smaller the better. This reduces coupling from the resonator element 15 to the bias pads 12.

The exemplary vertical capacitive silicon bulk acoustic wave resonator 10 may be fabricated to operate in one-port or two-port configurations. In the one-port configuration, the electrodes 14 are shorted together. In the two-port configuration, the electrodes 14 are independent of each other and function as drive and sense electrodes. One or both of the bias pads 12 are employed which are voltage biased.

FIG. 1 also shows that a tuning current generator 21 may be employed that couples current to the resonator element 15 by way of the bias pads 12 to heat the resonator element 15. This functions to frequency tune the resonator element 15 and vertical capacitive silicon bulk acoustic wave resonator 10.

Figure 2:
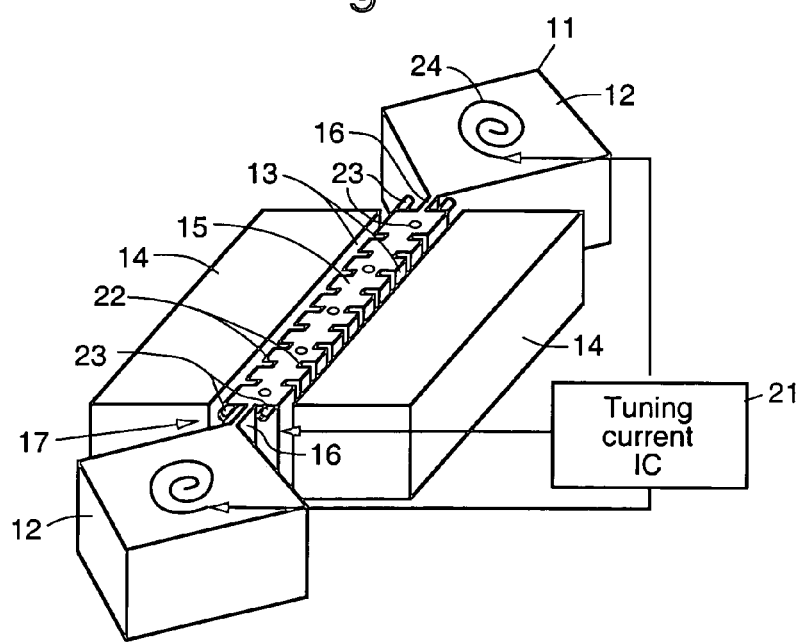
FIG. 2 illustrates a second exemplary embodiment of a capacitive silicon bulk acoustic wave resonator.

FIG. 2 illustrates a second exemplary embodiment of a capacitive silicon bulk acoustic wave resonator 10. The second embodiment of the resonator 10 is substantially similar to the resonator 10 shown in FIG. 1. However, in the resonator 10 shown in FIG. 2, the resonator element 15 has a plurality of notches 22 formed along surfaces adjacent to the electrodes 14 and capacitive gaps 13. The notches 22 are repeated periodically, and divide the resonator element 15 into a plurality of smaller mechanically connected structures.

In addition, heater elements 24 are shown disposed on the bias pads 12 that are coupled to the tuning current generator 21 and supply heat to the resonator element 15 to facilitate frequency tuning. A separate integrated circuit 21 may be employed as a control circuit that applies a temperature dependent electrical voltage or current to the resonator element 15 to cancel or control its temperature dependent frequency drift.

Also, the resonator element 15 is shown having one or more tuning elements 23 disposed thereon or extending therefrom. Frequency tuning is done by selectively removing at least a portion of the tuning elements 23. The tuning elements 23 may comprise metal particles or material, or additional portions of the material from which the resonator element 15 is made. Metal tuning elements 23 may be trimmed or removed using a laser, for example, which evaporates the tuning elements without affecting the underlying silicon material, for example.

Figure 1A:
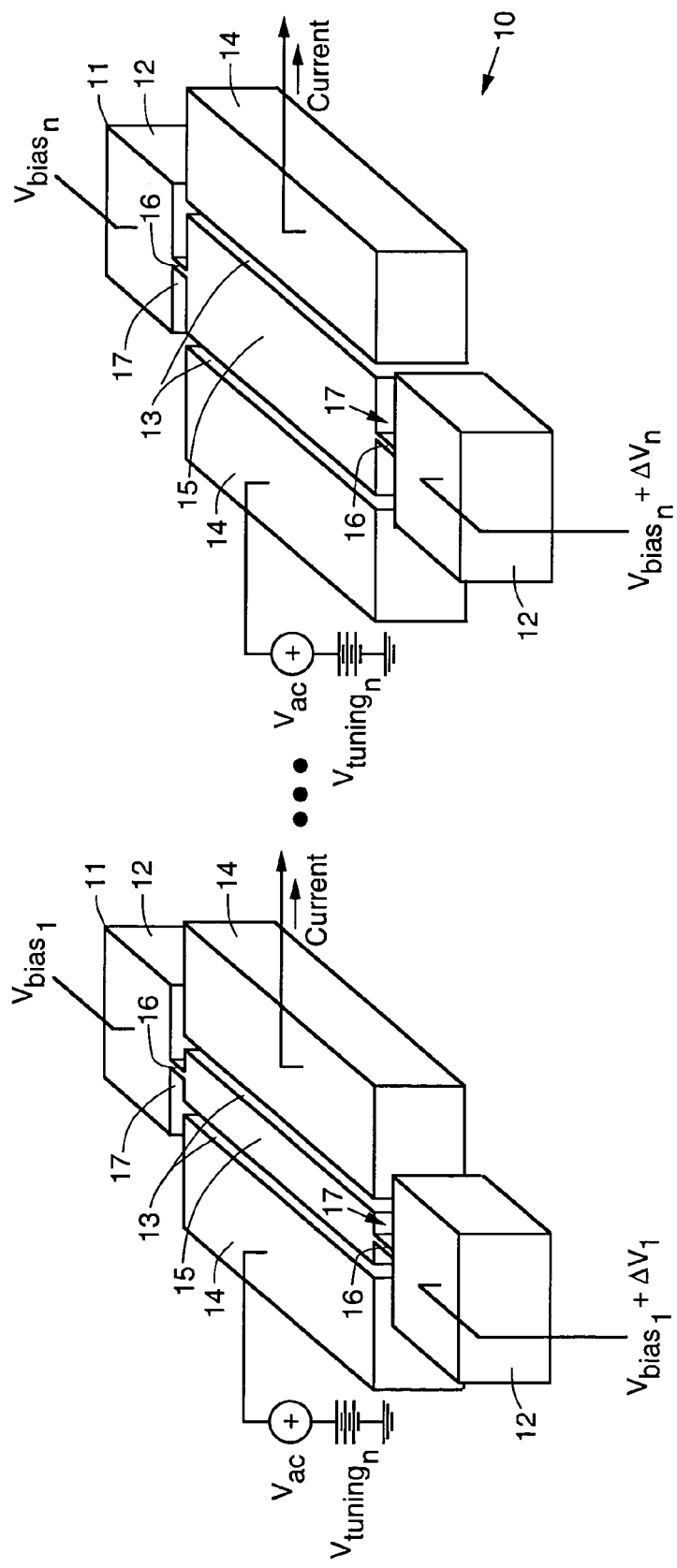
FIG. 1a shows an exemplary capacitive silicon bulk acoustic wave resonator having a plurality of resonator elements with different resonance frequencies (different resonator element widths) that are fabricated on a single substrate.

The vertical capacitive silicon bulk acoustic wave resonator 10 operates in width longitudinal mode. Compared to a piezoelectric film bulk acoustic wave resonator, where the resonant frequency is determined by the thickness of a deposited piezoelectric film, the resonant frequency of the vertical capacitive silicon bulk acoustic wave resonator 10 is determined by its lithographically defined horizontal thickness (width). Therefore resonators 10 with different resonant frequencies may be simultaneously fabricated on a single substrate. In addition, frequency tuning capability offered by capacitive transduction mechanisms may be used for post-fabrication fine-tuning of the resonators 10. FIG. 1a shows an exemplary capacitive silicon bulk acoustic wave resonator 10 having a plurality of resonator elements with different resonance frequencies (different resonator element widths) that are fabricated on a single substrate 11.

Equation 1 gives the electrical equivalent resistance for a two-port vertical (in-plane) capacitive resonator 10 in general:

$$R_{21} = \frac{\sqrt{KM}\,g^4}{Q\varepsilon_0^2 L_{\mathit{eff}} t^2 V_p^2} \propto \frac{g^4}{QV_p^2 L_{\mathit{eff}}^2 t},$$

where K and M are the effective mechanical mass and stiffness of the resonator 10, g is the size of the capacitive gap 17, Q is the quality factor of the resonator 10, $V_p$ is the applied polarization voltage, $L_{\mathit{eff}}$ is the effective length of the electrodes 14, and t is the thickness (height) of the resonator 10. The size (g) of the capacitive gap 13 has the most significant contribution in the equivalent resistance.

Increasing the thickness of a resonator 10 to lower the equivalent resistance was demonstrated for HARPSS VHF disk resonators in S. Pourkamali, et al, "VHF single crystal silicon capacitive elliptic bulk-mode disk resonators part II: implementation and characterization", JMEMS, Vol. 13, No. 6, December 2004 and Pourkamali and F. Ayazi, "High frequency capacitive micromechanical resonators with reduced motional resistance using the HARPSS technology", proceedings, 5th Silicon RF topical meeting 2004, pp. 147–150. It was shown theoretically that impedances in the sub-kilo-Ohm range can be achieved in VHF range for disk resonators by pushing fabrication limits to produce larger thickness and smaller capacitive gaps.

However, for UHF disk resonators with diameters smaller than 10 μm, the available area for sensing and actuation is extremely limited resulting in even higher impedances. Vertical capacitive silicon bulk acoustic wave resonators 10 fabricated using the HARPSS process can be tens of micrometers or more thick. On the other hand, the length of the resonator 10 ($L_{\mathit{eff}}$) can be tens to thousands of micrometers providing an extremely large capacitive transduction area. This sets the platform for implementation of low impedance VHF and UHF capacitive resonators 10 without the need for aggressive reduction of the capacitive gap sizes. Furthermore, as opposed to disk resonators, the resonant frequency of the vertical capacitive silicon bulk acoustic wave resonators 10 can be scaled up by reducing their width (horizontal thickness) without decreasing the available transduction area.

Conventional capacitive flexure beam resonators generally have a structure wherein a resonator element is coupled to adjacent bias pads. However, there are no support beams used in conventional capacitive flexure beam resonators. Furthermore, the resonant frequency of capacitive beam resonator element is a function of multiple in-plane lateral dimensions. Thus, the operating principles of the conventional capacitive flexure beam resonators are generally different from the presently disclosed vertical capacitive silicon bulk acoustic wave resonators 10.

HARPSS-on-SOI Fabrication Process

A three-mask HARPSS-on-SOI fabrication process, such as is discussed by S. Pourkamali and F. Ayazi, in "High frequency capacitive micromechanical resonators with reduced motional resistance using the HARPSS technology", proceedings, 5th Silicon RF topical meeting 2004, pp. 147–150, was used to implement vertical capacitive silicon bulk acoustic wave resonators 10. The process flow includes only three lithography steps and a number of thin film deposition and etching steps. HARPSS-on-SOI fabrication process is capable of producing tens of micrometer or more resonating elements 15 separated from polysilicon sense and drive electrodes 14 with micrometer-to-nanometer-sized capacitive gaps 13. The size of the capacitive gaps 13 is determined in a self-aligned manner by the thickness of a deposited sacrificial oxide layer.

Vertical capacitive silicon bulk acoustic wave resonators 10 with different dimensions and sizes of capacitive gaps 13 were fabricated on low resistivity SOI substrates 11. An exemplary resonator 10 has 225 nm capacitive gaps 13 and is supported at two sides by 3 μm wide, 10 μm long support beams 16. The support beams 16 are generally placed in the midpoint of the width of the resonator element 15, which has zero vibration amplitude along the width of the resonator element 15. However, other arrangements may readily be used. In addition, if the length of the support beams 16 is chosen to be equal to the quarter wavelength at the operating frequency (half of the thickness of the resonator element 15) it can minimize flow of energy to the substrate 11 and maximize the quality factor of the resonator 10.

Measurement and Characterization

Figure 3:
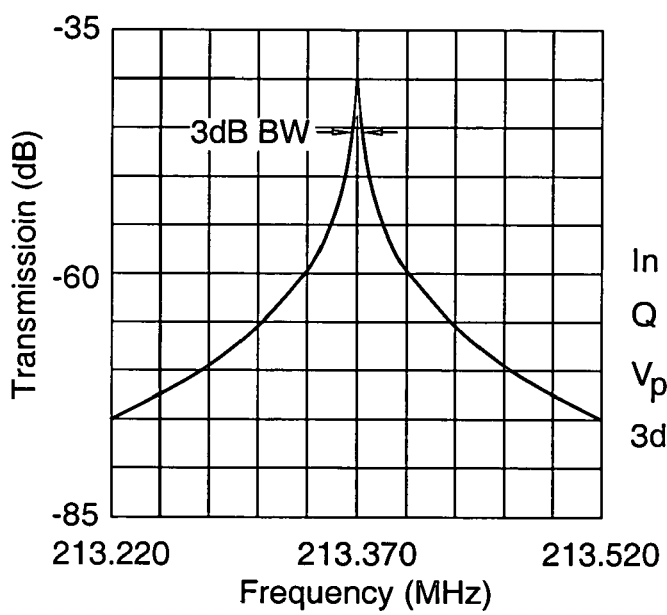
FIG. 3 is a graph that illustrates frequency response of an exemplary reduced to practice capacitive silicon bulk acoustic wave resonator in its first width longitudinal mode.

Fabricated resonators 10 were tested in a two-port configuration by direct connection to a network analyzer, and may also be operated in a one-port configuration. FIG. 3 shows the measured frequency response for an exemplary 80 μm long, 20 μm wide resonator 10. Quality factors of 28,700 in vacuum (shown in FIG. 3) and 20,200 in air (not shown) were measured for the first horizontal thickness longitudinal mode of this resonator 10 at 213.4 MHz. The measured quality factors are in the range of values measured for side supported SCS disk resonators with similar operating frequency discussed in the "High frequency capacitive micromechanical resonators with reduced motional resistance using the HARPSS technology" paper. Electrical equivalent resistance on the order of 6.3 kOhm was measured for this resonator 10 which is more than an order of magnitude lower than that of previously reported SCS disk resonators discussed in the "VHF single crystal silicon capacitive elliptic bulk-mode disk resonators part II: implementation and characterization" and "High frequency capacitive micromechanical resonators with reduced motional resistance using the HARPSS technology" papers, and to date is the lowest reported value for a capacitive resonator at such a high frequency.

The same resonator 10 was also operated in its third thickness longitudinal mode at 693 MHz with a Q of 6,000 for example. Due to the location and size of the support beams 16, in even thickness modes, the support beams 16 are subject to large vibration amplitude imposed by the resonator element 15 and introduces excessive loss. Consequently the quality factor is too small to detect the resonance peak. However, for higher order odd thickness modes the midpoint of the device width is still the resonance node and high quality factors can be obtained. Also, both even and odd mode may be used.

Figure 4:
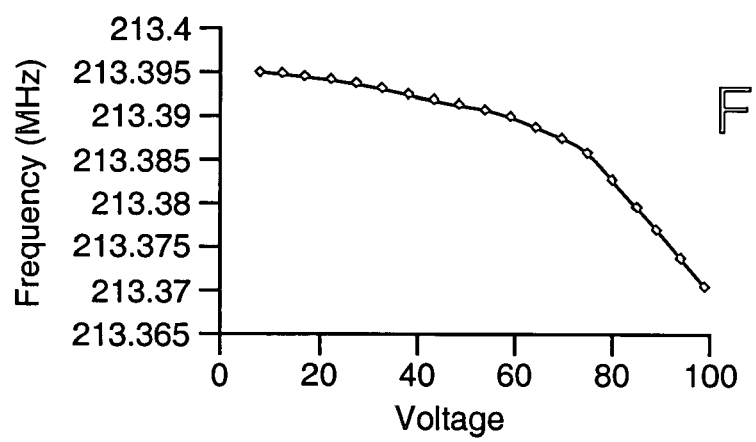
FIG. 4 is a graph that shows the measured electrostatic frequency tuning characteristic of an exemplary SiBAR showing 25 kHz of frequency tuning by changing the polarization voltage.

An electrostatic tuning range of 25 kHz was achieved for an exemplary (first mode) resonator 10 by changing the polarization voltage from 10V to 100 V as shown in FIG. 4.

Figure 5:
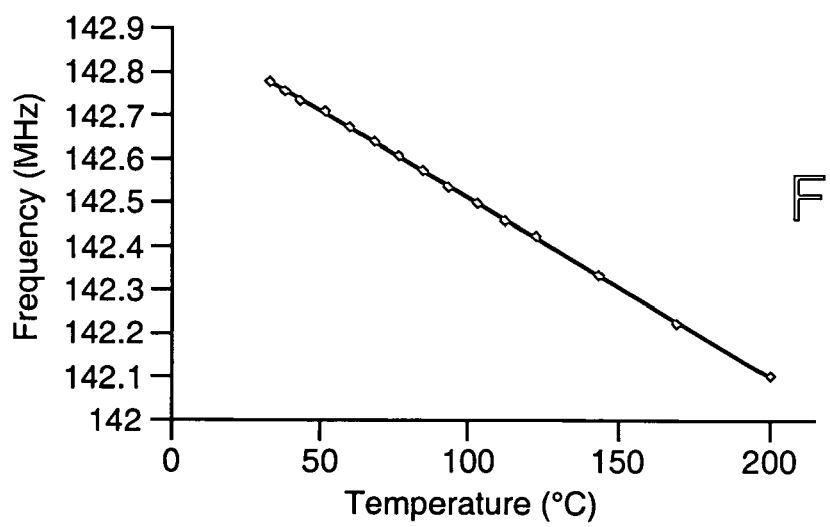
FIG. 5 is a graph that shows the typical temperature dependence of frequency of a 142.7 MHz single crystal silicon SiBAR showing a TCF of −26.6 ppm/° C.

FIG. 5 shows the measured temperature dependency of resonant frequency for a 142 MHz vertical capacitive silicon bulk acoustic wave resonator 10 over a temperature range of 24° C. to 200° C. The measured temperature coefficient of frequency (TCF) for this resonator 10 is −26.6 ppm/° C., which is very close the measured values for SCS disk resonators discussed in the "VHF single crystal silicon capacitive elliptic bulk-mode disk resonators part II: implementation and characterization" paper, and conventional piezoelectric film bulk acoustic wave resonators discussed in J. D. Larson, et al, "Power handling and temperature coefficient studies in FBAR duplexers for the 1900 MHz PCS band", Ultrasonics Symposium, 2000, Vol. 1, pp. 869–874.

Figure 6:
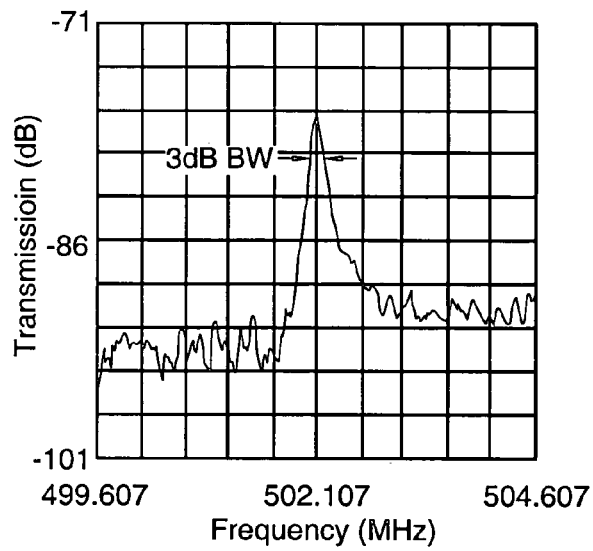
FIG. 6 is a graphs that show frequency response of an exemplary reduced to practice capacitive silicon bulk acoustic wave resonator operating in third width longitudinal modes.

FIG. 6 is a graph that shows frequency response in the UHF range measured for the third thickness modes of and exemplary vertical capacitive silicon bulk acoustic wave resonator 10. The measured quality factor is 3,100 at resonant frequency of 502 MHz corresponding to a 30 μm wide resonator 10, respectively.

Measured quality factors for vertical capacitive silicon bulk acoustic wave resonators 10 vary as a function of their dimensions. Increasing the length and thickness of the resonators 10 with equal frequencies and support size, does not degrade their quality factor. It is thus possible to reduce the equivalent resistance to any required level by increasing the length of the resonator 10 without sacrificing the quality factor.

Figure 7A:
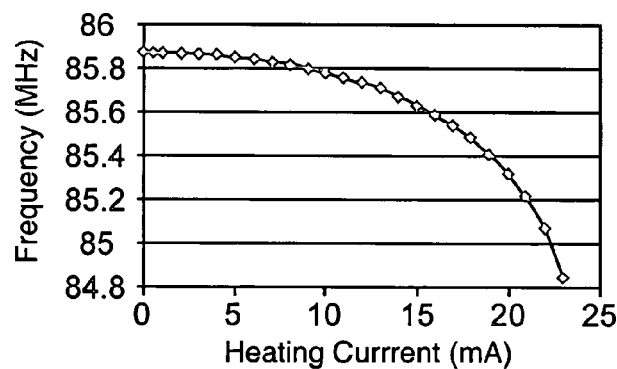
FIGS. 7a and 7b are graphs that illustrate test results relating to current tuning of the resonator.
Figure 7B:
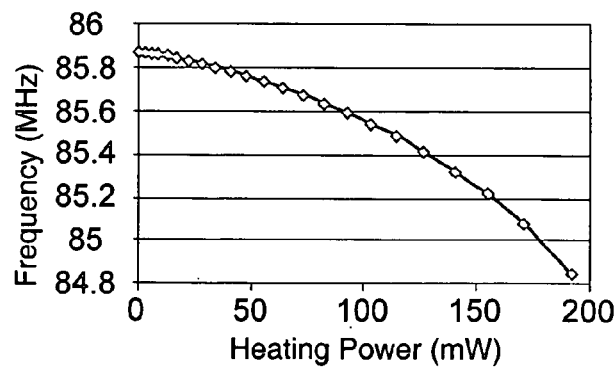

An effective but power consuming approach to tuning the resonance frequency of the resonator 10 involves passing current through its structure and consequently changing its temperature. Since the resonator element 15 is supported by two support beams 16 on two sides, two polarization voltage bonding pads (bias pads 12) are available on the two ends of the resonator 10. By applying slightly different DC voltages to the two pads 16 on the two ends of the resonator 10, DC current will pass through the SiBAR structure and elevate its temperature. FIGS. 7a and 7b show frequency tuning characteristics of an exemplary SiBAR resonator 10 achieved by passing current through the resonator 10. In particular, FIGS. 7a and 7b illustrate test results relating to current tuning of an exemplary resonator 10. More than 1 MHz (1.2%) of frequency tuning has been achieved by passing up to 24 mA of DC current through the body of the resonator 10. This corresponds to an elevated temperature of up to 450° C. for the resonator 10. Current tuning of the resonators can be done by passing AC current through the body of the resonator 10 as well.

Thus, capacitive vertical silicon bulk acoustic resonators have been disclosed that operate in the HF, VHF and UHF bands, exhibit low impedance values and have quality factors of several thousand to several hundreds of thousands. It is to be understood that the above-described embodiments are merely illustrative of some of the many specific embodiments that represent applications of the principles discussed above. Clearly, numerous and other arrangements can be readily devised by those skilled in the art without departing from the scope of the invention.

What is claimed is:

1. Acoustic resonator apparatus, comprising:
a substrate comprising a resonator element having a length-to-frequency-determining-width ratio larger than one and that is coupled by way of one or more support structures to one or more bias pads; and
one or more electrodes disposed adjacent sides of the resonator element and separated therefrom by one or more capacitive gaps;
and wherein the resonant frequency of the resonator element is primarily determined by a single in-plane lateral dimension.

2. The apparatus recited in claim 1 wherein the one or more electrodes comprise polycrystalline semiconductor material.

3. The apparatus recited in claim 1 wherein the resonator element has a length that is from several micrometers to hundreds of micrometers long.

4. The apparatus recited in claim 1 wherein the resonator element comprises a bar having rectangular cross sections.

5. The apparatus recited in claim 1 wherein the substrate comprises semiconductor-on-insulator material.

6. The apparatus recited in claim 1 which comprises a plurality of resonator elements having different resonance frequencies that are fabricated on a single substrate.

7. The apparatus recited in claim 6 wherein the resonator element has a length that is from several micrometers to hundreds of micrometers long.

8. The apparatus recited in claim 1 wherein the resonator element is operated at fundamental resonance and high order harmonic frequencies when electrical signals are applied to the one or more electrodes.

9. The apparatus recited in claim 1 wherein the resonator element comprises an anisotropic material.

10. The apparatus recited in claim 1 wherein the resonator element has a thickness-to-width ratio larger than one and is several micrometers to hundreds of micrometers thick.

11. The apparatus recited in claim 1 wherein the one or more support structures are disposed on sides of the resonator element.

12. The apparatus recited in claim 1 wherein the resonator element has a plurality of notches formed therein.

13. The apparatus recited in claim 12 wherein the notches are repeated periodically, dividing resonator element into a plurality of similar mechanically connected structures.

14. Acoustic resonator apparatus, comprising:
a substrate comprising a resonator element having a frequency-determining-width and that is coupled by way of one or more support structures to one or more bias pads; and
one or more electrodes disposed adjacent sides of the resonator element and separated therefrom by one or more capacitive gaps;
wherein the resonant frequency of the resonator element is primarily determined by a single in-plane lateral dimension;
and wherein the resonator apparatus is frequency tunable.

15. The apparatus recited in claim 14 wherein the resonator element has a length-to-frequency-determining-width ratio larger than one and a length that is from several micrometers to hundreds of micrometers long.

16. The apparatus recited in claim 14 wherein frequency tuning is done by passing electrical current through the resonating element to change and control its temperature.

17. The apparatus recited in claim 14 wherein frequency tuning is done by passing electrical current through a heater element disposed adjacent to the resonator element to change or control its temperature.

18. The apparatus recited in claim 14 wherein frequency tuning is done by applying a DC bias difference between the bias pads.

19. The apparatus recited in claim 14 wherein the resonator element is coupled to control circuitry for applying a temperature dependant electrical signal to the resonator element to cancel or control its temperature dependant frequency drift.

20. The apparatus recited in claim 14 wherein one or more tuning elements are disposed on or attached to the resonator apparatus and frequency tuning is done by selectively removing at least a portion of the tuning elements.

* * * * *

UNITED STATES PATENT AND TRADEMARK OFFICE
CERTIFICATE OF CORRECTION

| | | |
|---|---|---|
| PATENT NO. | : 7,176,770 B2 | |
| APPLICATION NO. | : 11/208818 | |
| DATED | : February 13, 2007 | |
| INVENTOR(S) | : Farrokh Ayazi et al. | |

It is certified that error appears in the above-identified patent and that said Letters Patent is hereby corrected as shown below:

The following section should be added before the Background of the Invention section:

Col. 1 Line 1-3
STATEMENT REGARDING FEDERALLY SPONSORED RESEARCH OR DEVELOPMENT

This invention was made with Government support under Contract No. DAAH01-01-1-R004 awarded by the US Army Aviation and Missile Command. The Government has certain rights in the invention.

Signed and Sealed this

Fourth Day of March, 2008

JON W. DUDAS
*Director of the United States Patent and Trademark Office*